Figure 1:
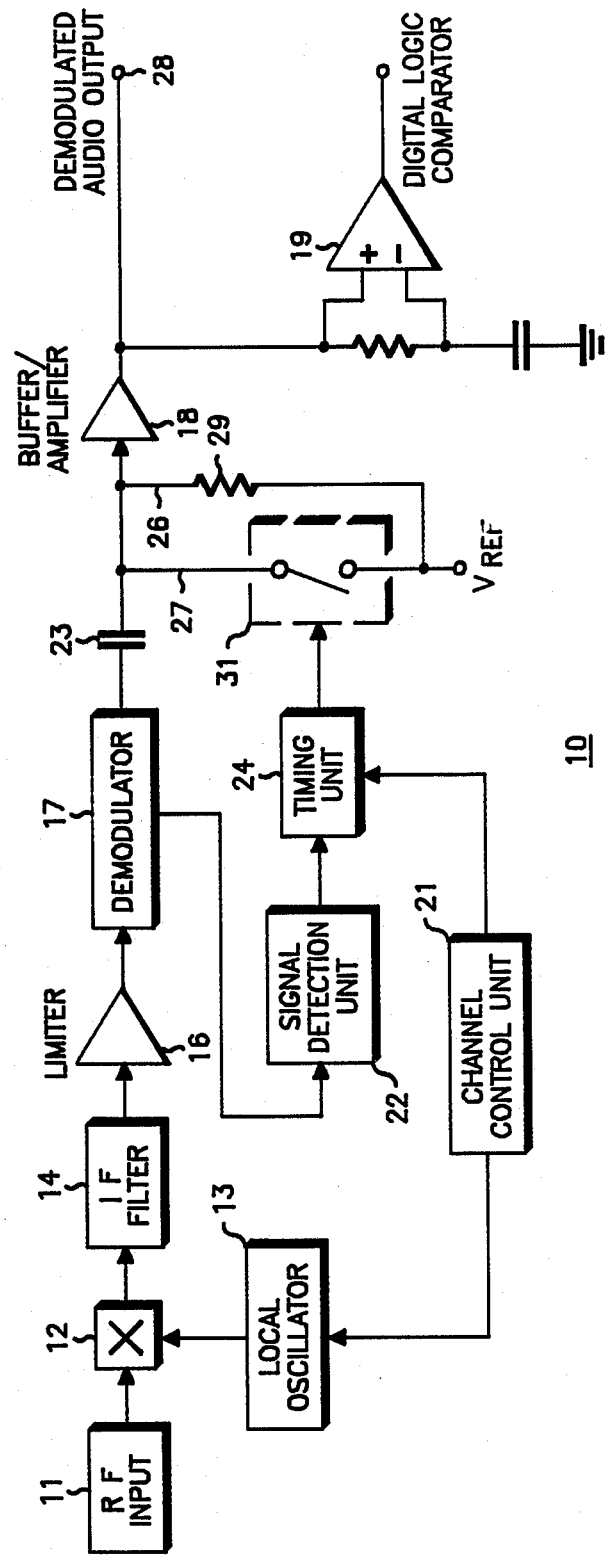

United States Patent [19]

Heck et al.

[11] Patent Number: 4,829,594
[45] Date of Patent: May 9, 1989

[54] ADAPTIVE CORRECTION OF DC ERROR TRANSIENTS

[75] Inventors: Joseph P. Heck, Ft. Worth, Tex.; Kha Le, Plantation, Fla.

[73] Assignee: Motorola, Inc., Schaumburg, Ill.

[21] Appl. No.: 910,590

[22] Filed: Sep. 23, 1986

[51] Int. Cl.[4] .............................................. H04B 1/10
[52] U.S. Cl. .................................... 455/334; 455/312; 455/214
[58] Field of Search ............... 455/218, 222, 214, 312, 455/334; 375/99, 104; 330/177

[56] References Cited

U.S. PATENT DOCUMENTS

| 3,049,710 | 8/1962 | Buesing | 455/212 |
| 4,107,614 | 8/1978 | Sugai | 455/218 |
| 4,627,101 | 12/1986 | Anderson et al. | 455/212 |
| 4,628,539 | 12/1986 | Selwa | 455/212 |

Primary Examiner—Michael A. Masinick
Attorney, Agent, or Firm—Steven G. Parmelee

[57] ABSTRACT

A capacitor bias unit includes a first path (26) having a first impedance (29) and a second path (27) having a low impedance and a switch (31) connected between a voltage reference source and a capacitor (23). The capacitor can either be subjected to normal charge characteristics or quick charge by closing the switch (31). Maintaining an appropriately charged state on the capacitor (23) aids in preventing netting error voltage steps from introducing DC component signals that adversely effect proper decoding and reception of demodulated data.

10 Claims, 2 Drawing Sheets ial radio frequency signals. These radio frequency signals are reduced to a lower frequency signal in an IF stage, and then demodulated to extract the information of interest. Such information may be in analog or digitized form. Demodulated analog information will typically be provided to an audio processing circuit, and digitized data will be decoded and acted upon by an appropriate logic circuit.

ADAPTIVE CORRECTION OF DC ERROR TRANSIENTS

TECHNICAL FIELD

This invention relates generally to radio receivers, and more particularly to correction of netting error transients on demodulated data.

BACKGROUND ART

In a typical radio receiver, an antenna transduces airborne radio frequency signals of interest into electrical radio frequency signals. These radio frequency signals are reduced to a lower frequency signal in an IF stage, and then demodulated to extract the information of interest. Such information may be in analog or digitized form. Demodulated analog information will typically be provided to an audio processing circuit, and digitized data will be decoded and acted upon by an appropriate logic circuit.

When a broadcast signal first appears on a monitored channel, or when initially tuning a radio receiver to a new channel then having a broadcast signal present thereon, a voltage step typically occurs at the output of the demodulator (in a frequency modulation system). The magnitude of this voltage step may depend upon a variety of factors, but often comprises a netting error that depends particularly upon the frequency tolerance of the transmitting signal oscillator and the tolerance of the local oscillator (or oscillators) in the receiver.

Not infrequently, the magnitude of this voltage step can be the equivalent to 2 kHz of frequency error or more. This constitutes a significant error, since modulation of the desired signal may be limited to a maximum deviation of only 5 kHz. In addition to the error considerations noted above, the voltage step transiently present at the output of the demodulator, in combination with the signal modulation, may saturate any subsequent amplification stages. This also presents a serious impediment to satisfactory reception performance.

These problems are typically transitory in nature, and hence may be acceptable under some operating circumstances. In other situations, however, these problems are unacceptable. For instance, when receiving low deviation FSK data (having, for instance, 500 to 1000 Hz deviation), the demodulated waveform must be recentered to account for any netting error in order to assure that the "1's" and "0's" comprising the digitized data are accurately distinguished. Many prior art radios use diode-RC networks or center slicers to perform this function. Unfortunately, such prior art techniques require up to hundreds of milliseconds to effectively center the demodulated signal For many systems, this means that much important data will be lost.

There exists a need for a device to correct such netting error transients in a relatively short period of time to prevent such loss of information. Such a device should correct netting error transients that occur both when tuning to a new channel, and also when a monitored previously quiescent channel suddenly becomes active.

SUMMARY OF THE INVENTION

These needs and others are substantially met through provision of the adaptive correction device disclosed herein The invention essentially provides for a capacitor to be operably coupled to the output of the demodulator of the radio receiver, and for a capacitor bias unit to be provided for adaptively controlling DC biasing of the capacitor.

In one embodiment, the capacitor connects in series between the output of the demodulator and the input of a subsequent buffer/amplifier stage. The output of the buffer/amplifier stage then connects as appropriate to an audio processing circuit and a digital logic processing circuit. The downstream side of the capacitor also connects to the capacitor bias unit.

More particularly, the capacitor bias unit includes a preselected DC reference voltage that connects to the downstream side of the capacitor through a first path having a first resistance and a second path having a second resistance and a switch. The magnitude of the first resistance far exceeds the magnitude of the second resistance.

The switch of the capacitor bias unit responds to an appropriate control signal to close the second path and effectively establish a low impedance path between the DC reference voltage and the capacitor.

The control signal for the switch can be provided by making the switch responsive to a signal detection unit (such as, for instance, a squelch unit) for the radio (thereby making the switch responsive to the initiation of channel activity on a previously monitored channel) and/or to a channel control unit (thereby making the switch responsive to any change of channel frequency).

During operation, the capacitor will ordinarily receive appropriate biasing from the DC reference voltage source to assure adequate that the input of the following buffer stage is adequately biased. During those times when netting error transients are likely to introduce additional signal aberations, the switch of the capacitor bias unit closes to provide a low impedance path from the DC voltage reference source to the capacitor to provide for a very rapid charging current. As a result, the capacitor can react quickly to the changed circumstances and continue to prevent DC voltage aberations from corrupting the data in question. Furthermore, rather than requiring hundreds of milliseconds to achieve this result, the capacitor bias unit provides the desired function in only a few milliseconds, thereby adequately supporting low deviation FSK data and other similar types of low deviation signal.

Figure 2:
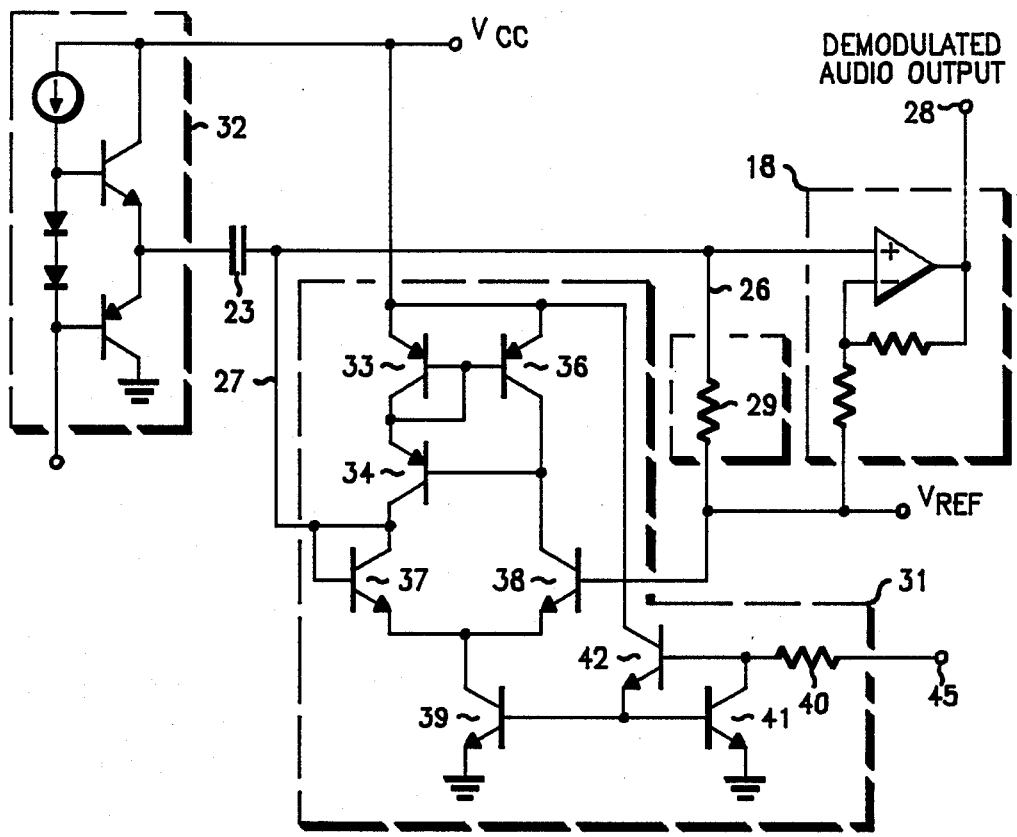

These and other benefits of the invention will become more clear upon making a thorough review and study of the following description of the best mode for carrying out the invention, particularly when reviewed in conjunction with the drawings, wherein:

FIG. 1 comprises a block diagram depiction of the invention as configured in a radio receiver;

FIG. 2 comprises a schematic diagram of the invention; and

Figure 3:
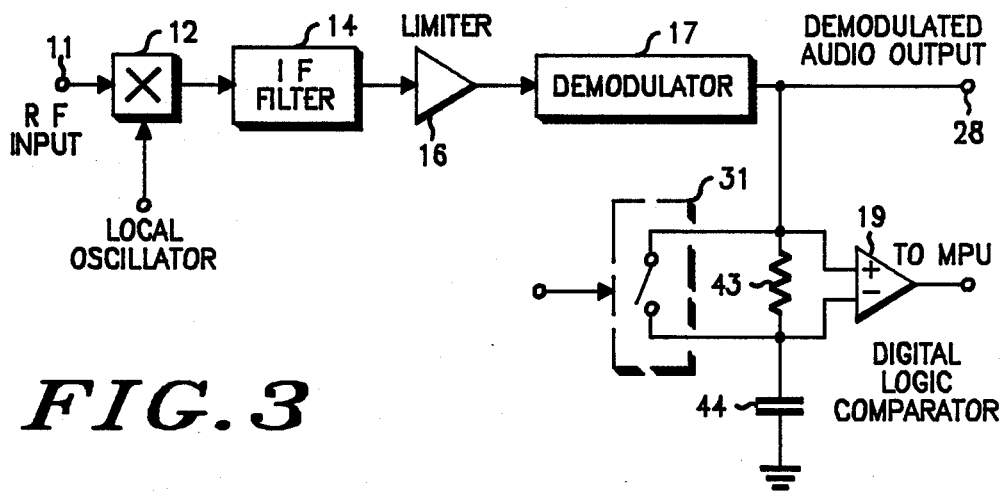

FIG. 3 comprises a block diagram depiction of an alternative embodiment.

BEST MODE FOR CARRYING OUT THE INVENTION

Referring now to the drawings, and in particular to FIG. 1, the invention can be seen as depicted in conjunction with certain general components of a typical radio receiver denoted by the reference numeral 10. The radio receiver (10) includes an RF input (11), a mixer (12), a local oscillator (13), an IF filter (14), a limiter (16), a demodulator (17), a buffer/amplifier (18), a digital logic comparator (19), a channel control unit (21), and a signal detection unit (22). The invention includes a capacitor (23), a timing unit (24), a first path (26) for connecting the capacitor (23) to a DC reference voltage ($V_{REF}$), and a second path (27) for connecting the capacitor (23) to the DC reference voltage ($V_{REF}$). Each of the above generally referred to components will now be described in more detail in seriatim fashion.

With continued reference to FIG. 1, the RF input (11) may be comprised of an antenna and preselector filter as well understood in the prior art. The output of the RF input (11) connects to a mixer (12) that receives an appropriate injection signal from a local oscillator (13). The output of the mixer (12) comprises an intermediate frequency signal that passes through an appropriate IF filter (14) and limiter (16) to the input of a demodulator (17) in accordance with well understood prior art technique. The demodulator functions to demodulate the intermediate frequency signal and extract the information contain therein.

The output of the demodulator (17) connects through a capacitor (23) to the input of a buffer/amplifier (18). The time constant of the capacitor (23) times the input impedance of the buffer/amplifier (18) must be sufficiently long to allow passage of the lowest frequency of modulation expected at the demodulator (17) output. The output of the buffer/amplifier (18) comprises a demodulated audio output (28) that can connect to appropriate audio processing circuitry as desired. The output of the buffer/amplifier (18) also connects to an appropriately configured digital logic comparator (19) to allow digital information to be appropriately decoded and subsequently processed as desired.

A $V_{REF}$ source (typically having a value of ½ the supply voltage) connects to the downstream side of the capacitor (23) through a first path (26) that includes a resistor (29). $V_{REF}$ also connects to the downstream side of the capacitor (23) through an appropriate switch (31). This switch (31) (which is normally open) connects to a timing unit (24), which in turn responds to a signal detection unit (22) and/or channel control unit (21). Both the signal detection unit (22) and the channel control unit (21) may be of any desired configuration as well understood in the prior art. The timing unit (24) may also be of any known desired configuration, so long as it retains an ability to trigger the switch (31) "on" in response to an appropriate input signal for a period of time as explained below.

In operation, both the signal detection unit (22) and the channel control unit (21) can effectively trigger the timing unit (24) to cause the switch (31) to close the second path (27) for a predetermined period of time (typically a few milliseconds). The exact period of time allotted should be sufficient to at least match the time constant of the capacitor (23) in view of the sum of the output impedance of the demodulator (17) plus the impedance of the switch (31).

It can be seen that when the switch (31) closes, the capacitor (23) can charge very rapidly and be better conditioned to respond to netting error transients that may occur.

Referring now to FIG. 2, a more detailed description of the invention will be provided.

The capacitor (23) can be seen as configured in series between an output stage (32) of the demodulator and an input port of the buffer/amplifier (18). As described above, the first path (26) of the capacitor bias unit includes a resistor (29) connected between the downstream side of the capacitor (23) and a DC reference voltage source ($V_{REF}$). Similarly, the second path (27) includes a switch (31) connected between the downstream side of the capacitor (23) and $V_{REF}$. In this embodiment, the switch (31) has been provided through use of an operational transconductance amplifier, which switch (31) will now be described.

In the switch (31), a first PNP transistor (33) has its emitter connected to $V_{CC}$ and its collector connected to the base thereof and to the emitter of a second PNP transistor (34). The base of the latter transistor (34) connects to the collector of a third PNP transistor (36), the emitter of which connects to $V_{CC}$ and the base of which connects to the base of the first PNP transistor (33).

The collector of the second PNP transistor (34) connects to the downstream side of the capacitor (23), and to the base and collector of a first NPN transistor (37). The emitter of this transistor (37) connects to the emitter of a second NPN transistor (38) and also to the collector of a third NPN transistor (39). The collector of the second NPN transistor (38) connects to the base of the second PNP transistor (34) and to the collector of the third PNP transistor (36), and the base thereof connects to $V_{REF}$.

The emitter of the third NPN transistor (39) connects to ground, and the base thereof connects to the bsse of a fourth NPN transistor (41), the emitter of which connects to ground and the collector of which connects to the base of a fifth NPN transistor (42). The emitter of the fifth transistor (42) connects to the base of the third and fourth NPN transistors (39 and 41), and the collector connects to $V_{CC}$. Finally, the base of the fifth NPN transistor (42) connects through an appropriate resistor (40) to receive the control signal from the timing unit (24) (FIG. 1).

When the control signal voltage (45) is low, all of the transistors in the switch (31) will be off. As a result, the output of the switch (31) as connected to the downstream side of the capacitor (23) presents an effective open circuit In the presence of an appropriate control signal, the operational transconductance amplifier functions as a unity gain buffer that forces the output voltage presented to the downstream side of the capacitor (23) to equal the input voltage at the base of the second NPN transistor (38)(i.e., $V_{REF}$). The buffer will supply a charging current determined by the magnitude of the control voltage (45), the resistor (40), and the area ratios of transistors numbered 39 and 41, until the voltage at the downstream side of the capacitor (23) equals $V_{REF}$.

The switch (31) could obviously be provided through many various mechanisms The particular embodiment depicted, however, is particularly compatible with bipolar IC circuit structure and hence may be easily implemented through use of that technology.

Referring now to FIG. 3, an alternative configuration for the invention can be seen as depicted in conjunction with a radio having a demodulator stage (17) that provides a signal of sufficient strength to obviate the need for a subsequent buffer/amplifier stage. The resistor (43)/capacitor (44) time constant here must be long enough to adequately filter any signal modulation, such that essentially only the DC component appearing at the output of the demodulator (17) will appear at the inverting input of the digital logic comparator (19).

In this configuration, the switch (31) can be directly connected in parallel with the resistor (43) that connects across the inputs to the digital logic comparator (19). So configured, the resistor (43) and the switch (31) are connected in parallel between the output of the demodulator (17) and a grounded capacitor (44).

As in the above described embodiment, in ordinary use the switch (31) will be open. Therefore, any DC component present at the output of the demodulator (17) will be transferred to the capacitor (44) through the first path that includes the resistor (43). Upon detecting signal activity, or upon detecting a channel switch as described above, the switch (31) will close and provide a low impedance path between the DC component at the output of the demodulator (17) and the capacitor (44), to thereby allow the capacitor (44) to quickly charge and provide the same benefits as described above with respect to the first embodiment.

Those skilled in the art will recognize that various modifications and changes could be made with respect to the above described embodiments without departing from the spirit and scope of the inventive concepts set forth It should therefore be understood that the attached claims are not to be considered as being limited to the precise embodiments set forth in the absence of specific limitations directed thereto

We claim:

1. A radio receiver for receiving a broadcast signal of interest, comprising:
   output means for providing an output signal comprising information demodulated from said broadcast
   capacitor means operably coupled to said output means;
   capacitor bias means for biasing said capacitor means with a preselected DC reference voltage, comprising:
      a first path having a first resistance operably connected between said D.-C reference voltage and said capacitor means; and
      a second path having a second resistance operably connected between said DC reference voltage and said capacitor means, wherein said second resistance is less than said first resistance.

2. The radio receiver of claim 1 wherein said second path includes switch means for allowing said second path to be selectively closed and opened.

3. The radio receiver of claim 2 and further including channel control means for selecting said broadcast signal of interest from a plurality of broadcast signals to which said radio receiver may be tuned.

4. The radio receiver of claim 3 wherein said switch means are responsive to said channel control means such that said switch means will close said second path to connect said DC reference voltage to said capacitor whenever said channel control means selects a different broadcast signal.

5. The radio receiver of claim 4 and further including timing means for causing said switch means, when closed, to remain closed for only a predetermined period of time.

6. The radio receiver of claim 2 and further including signal detection means for detecting signal activity on a channel.

7. The radio receiver of claim 6 wherein said switch means are responsive to said signal detection means such that said switch means will close said second path to connect said DC reference voltage to said capacitor whenever said signal detection means first detects signal acitivity on a channel.

8. A radio receiver for receiving a broadcast signal of interest, comprising:
   output means for providing an output signal comprising information demodulated from said broadcast signal;
   capacitor means operably coupled to said output means;
   capacitor bias means for biasing said capacitor means with a DC voltage, comprising
      a first path having a first resistance operably connected between said DC voltage and said capacitor means; and
      a second path having a second resistance operably connected between said DC voltage and said capacitor means, wherein said second resistance is less than said first resistance.

9. The radio receiver of claim 8 wherein said DC voltage appears at an output of said output means.

10. The radio receiver of claim 9 wherein said DC voltage and said output signal of said output means are provided at a common output thereof.

* * * * *

UNITED STATES PATENT AND TRADEMARK OFFICE
CERTIFICATE OF CORRECTION

PATENT NO. : 4,829,594

DATED : May 9, 1989

INVENTOR(S) : Joseph P. Heck et al.

It is certified that error appears in the above-identified patent and that said Letters Patent is hereby corrected as shown below:

Col. 5, line 27, after the word "broadcast" please insert therefor --signal;--.

Col. 5, line 34, "D.-C" should read --DC--.

Signed and Sealed this

Sixth Day of February, 1990

*Attest:*

JEFFREY M. SAMUELS

*Attesting Officer*     *Acting Commissioner of Patents and Trademarks*